US012671439B2

(12) United States Patent
Zhou et al.

(10) Patent No.: US 12,671,439 B2
(45) Date of Patent: Jun. 30, 2026

(54) TOUCH DETECTION CIRCUIT, TOUCH SENSING CHIP AND ELECTRONIC DEVICE

(71) Applicant: SILEAD INC., Shanghai (CN)

(72) Inventors: Jinling Zhou, Shanghai (CN); Jun Yang, Shanghai (CN); Hongzhen Chen, Shanghai (CN)

(73) Assignee: SILEAD INC., Shanghai (CN)

( * ) Notice: Subject to any disclaimer, the term of this patent is extended or adjusted under 35 U.S.C. 154(b) by 132 days.

(21) Appl. No.: 18/740,664

(22) Filed: Jun. 12, 2024

(65) Prior Publication Data

US 2025/0007533 A1     Jan. 2, 2025

(30) Foreign Application Priority Data

Jun. 27, 2023    (CN) .......................... 202310773577.5

(51) Int. Cl.
*H03M 3/00*         (2006.01)
*G06F 3/041*        (2006.01)
*G06F 3/044*        (2006.01)

(52) U.S. Cl.
CPC ........ *H03M 3/464* (2013.01); *G06F 3/04166* (2019.05); *G06F 3/041662* (2019.05); *G06F 3/044* (2013.01); *G06F 3/0446* (2019.05)

(58) Field of Classification Search
CPC .............. H03M 3/464; G06F 3/041662; G06F 3/04166; G06F 3/044; G06F 3/0446

USPC .......................................................... 341/143
See application file for complete search history.

(56)                References Cited

U.S. PATENT DOCUMENTS 9,587,964 B2 *    3/2017    Curtis ................... H03M 3/462
10,120,512 B2 *   11/2018    Tang ..................... G06F 3/0418

* cited by examiner

*Primary Examiner* — Khai M Nguyen
(74) *Attorney, Agent, or Firm* — Ziegler IP Law Group, LLC.

(57)                    ABSTRACT

A touch detection circuit, a touch sensing chip and an electronic device are disclosed. The touch detection circuit includes: a charge/discharge circuit, a $1^{st}$-order N-bit $\Delta\Sigma$ADC comprising an adder, an integrator, an N-bit ADC and an N-bit DAC, the adder comprising two input terminals coupled respectively to an output terminal of the charge/discharge circuit and an output terminal of the N-bit DAC, the N-bit DAC comprising an input terminal coupled to an output terminal of the N-bit ADC, wherein the integrator is configured to integrate net incoming charge that the integrator receives; the N-bit ADC is configured to quantize an output of the integrator into an N-bit digital signal; the N-bit DAC is configured to provide subtractive reference charge according to the instruction of the N-bit digital signal; and the adder is configured to derive the net incoming charge by subtracting the subtractive reference charge from the sense charge.

16 Claims, 4 Drawing Sheets

TOUCH DETECTION CIRCUIT, TOUCH SENSING CHIP AND ELECTRONIC DEVICE

CROSS-REFERENCES TO RELATED APPLICATION

This application claims the priority of Chinese patent application number 202310773577.5, filed on Jun. 27, 2023, the entire contents of which are incorporated herein by reference.

TECHNICAL FIELD

The present invention relates to the field of touch sensing and, in particular, to a touch detection circuit, a touch sensing chip and an electronic device.

BACKGROUND

Currently, capacitive touch screens, which typically rely on capacitive sensors for touch detection, are widely used in various electronic devices.

SUMMARY OF THE INVENTION

It is an objective of the present invention to provide a touch detection circuit, a touch sensing chip and an electronic device.

The present invention provides a touch detection circuit including:

a charge/discharge circuit, which is coupled to a corresponding sense channel of a touch screen and is configured to charge or discharge the sense channel over a scanning period, thereby converting a sense signal on the sense channel into corresponding sense charge;

a $1^{st}$-order N-bit $\Delta\Sigma$ADC including an adder, an integrator, an N-bit ADC and an N-bit DAC, the adder including two input terminals coupled respectively to an output terminal of the charge/discharge circuit and an output terminal of the N-bit DAC, the N-bit DAC including an input terminal coupled to an output terminal of the N-bit ADC, where N is an integer satisfying N≥2, wherein the integrator is configured to integrate net incoming charge that it receives; the N-bit ADC is configured to quantize an output of the integrator into an N-bit digital signal; the N-bit DAC is configured to provide subtractive reference charge according to the instruction of the N-bit digital signal; and the adder is configured to derive the net incoming charge by subtracting the subtractive reference charge from the sense charge.

Optionally, after the 1st-order N-bit $\Delta\Sigma$ADC circuit stabilizes, the net incoming charge may be equal to or close to 0.

Optionally, the integrator may include an integrator amplifier, an integrator capacitor and an integrator switch, the integrator amplifier including a first input terminal coupled to an output terminal of the adder, a first terminal of the integrator capacitor and a first terminal of the integrator switch, the integrator amplifier including a second input terminal coupled to a common reference voltage, the integrator amplifier including an output terminal coupled to an input terminal of the N-bit ADC, a second terminal of the integrator capacitor and a second terminal of the integrator switch.

Optionally, a capacitance of the integrator capacitor may be adjustable, precision of the N-bit digital signal is associate with the capacitance of the integrator capacitor. Alternatively, a range of measurement of the N-bit ADC may be adjustable, precision of the N-bit digital signal is associate with the range of measurement of the N-bit ADC.

Optionally, the N-bit DAC may include two parallel-connected capacitor arrays of the same structure, each capacitor array including N capacitors, a first terminal of each capacitor coupled to a common reference voltage through a reset switch, a second terminal of each capacitor coupled to a first power supply voltage or a second power supply voltage according to the N-bit digital signal, the N capacitors having different capacitances forming a geometric sequence with a starting value of $C\mu/2$ and with a common ratio of 2, where $C\mu$ is a constant value, wherein when the N-bit DAC is reset, the other terminal of one of the capacitors in one of the capacitor arrays is coupled to the first power supply voltage, the other terminal of a respective one of the capacitors of the same capacitance in the other capacitor array is coupled to the second power supply voltage.

Optionally, the 1st-order N-bit $\Delta\Sigma$ADC circuit may further include a digital filter coupled to the output terminal of the N-bit ADC, the digital filter configured to convert the N-bit digital signal into a Q-bit digital signal, where Q is an integer satisfying Q≥N.

Optionally, the N-bit ADC may utilize an oversampling technique to sample and quantize the output of the integrator, where Q>N.

Optionally, the charge/discharge circuit may include first to third switches and a current source, wherein in a self-capacitance scan mode, a first terminal of the current source is coupled to a second power supply voltage, a second terminal of the current source is coupled to a first terminal of the second switch, a second terminal of the second switch is coupled to a first terminal of the first switch, a first terminal of the third switch and the sense channel, a second terminal of the first switch is coupled to a first power supply voltage, and a second terminal of the third switch is coupled to the input terminal of the adder.

Optionally, the charge/discharge circuit may include first to third switches and a current source, wherein in a mutual capacitance scan mode, a first terminal of the current source is coupled to a first power supply voltage, a second terminal of the current source is coupled to a first terminal of the second switch, a second terminal of the second switch is coupled to a first terminal of the first switch, a first terminal of the third switch and the sense channel, a second terminal of the first switch is coupled to a common reference voltage, and a second terminal of the third switch is coupled to the input terminal of the adder.

Optionally, the touch detection circuit may be coupled to the sense channel in one-to-one correspondence, or the touch detection circuit may be coupled to one or more sense channels.

On the basis of the same inventive concept, the present invention also provides a touch sensing chip including touch detection circuits according to the present invention.

On the basis of the same inventive concept, the present invention also provides an electronic device including a touch screen and the touch sensing chip of the present invention. The touch screen includes a number of sense channels and a number of transmit channels. The touch sensing chip is coupled to each of the sense channels and each of the transmit channels.

BRIEF DESCRIPTION OF THE DRAWINGS

Those of ordinary skill in the art would appreciate that the accompanying drawings are provided to facilitate a better understanding of the present invention and do not limit the scope thereof in any sense, in which.

DETAILED DESCRIPTION

Figure 1:
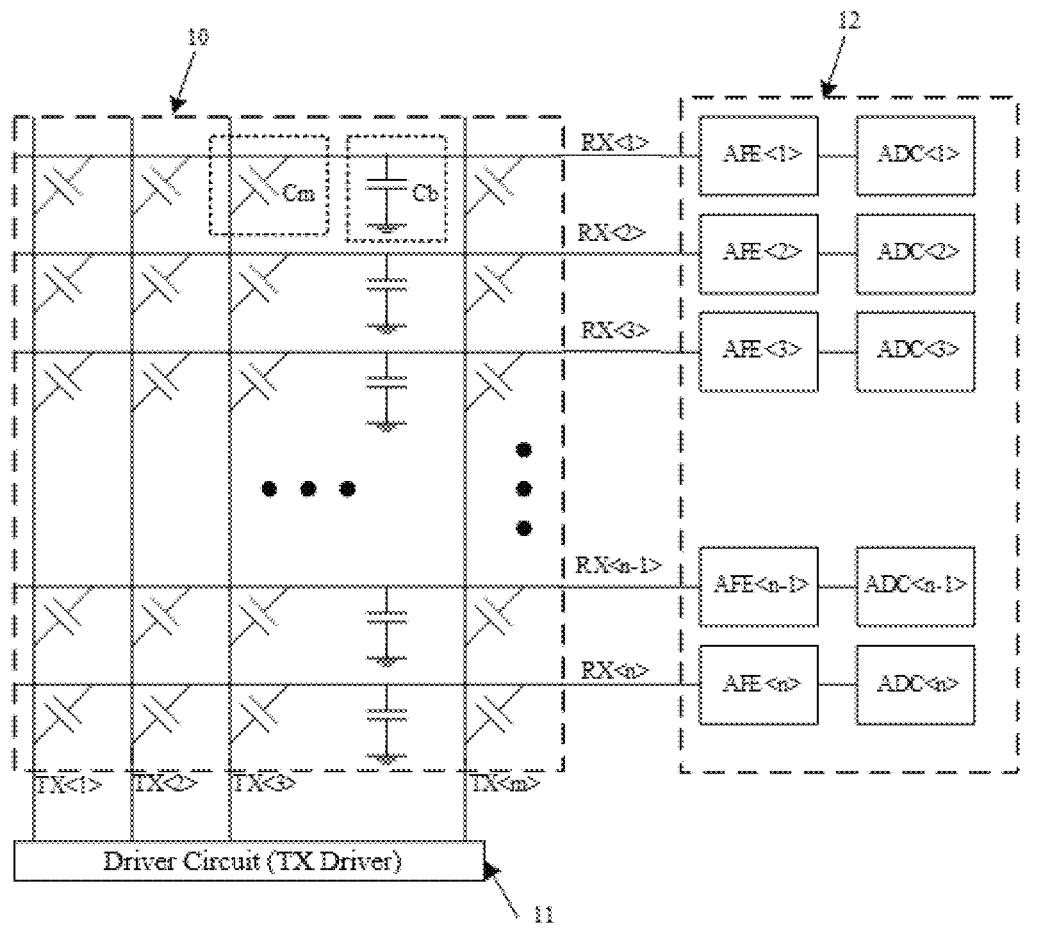
FIG. 1 schematically illustrates operation of a conventional touch sensing chip.

The following description sets forth numerous specific details in order to provide a more thorough understanding of the present invention. However, it will be apparent to those skilled in the art that the present invention can be practiced without one or more of these specific details. In other instances, well-known technical features have not been described in order to avoid unnecessary obscuring of the invention. It is to be understood that the invention may be embodied in many different forms and should not be construed as being limited to the embodiments set forth below. Rather, these embodiments are provided so that this disclosure is thorough and conveys the scope of the invention to those skilled in the art. In the drawings, like reference numerals refer to like elements throughout. It will be understood that when an element is referred to as being "connected to" or "coupled to" another element, it can be directly connected or coupled to the other element, or intervening elements may also be present. In contrast, when an element is referred to as being "directly connected to" another element, there are no intervening elements. As used herein, the singular forms "a", "an" and "the" are intended to include the plural forms as well, unless the context clearly indicates otherwise. It will be further understood that the term "comprising" specifies the presence of stated features, steps, operations, elements, and/or components, but do not preclude the presence or addition of one or more other features, steps, operations, elements, components, and/or groups thereof. As used herein, the term "and/or" includes any and all combinations of the associated listed items.

A touch sensing chip for use in a conventional organic light-emitting diode (OLED) touch screen is schematically depicted in FIG. 1. Typically, the OLED touch screen 10 has a number of longitudinally running transmit channels (or transmit lines) TX and a number of transversely running sense channels (or sense lines) RX. The transmit channels TX cross the sense channels RX at sense nodes. Typically, the touch sensing chip includes a driver circuit 11 coupled to the transmit channels TX and a touch detection circuit 12 coupled to the sense channels RX. Depending on the size and shape of the OLED touch screen 10, the numbers of transmit TX and sense RX channels may vary. In the OLED touch screen 10 shown in FIG. 1, there are n sense channels RX and m transmit channels TX. That is, the OLED touch screen 10 is a screen model with n sense channels RX (i.e., RX<1>-RX<n>) and m transmit channels TX (i.e., TX<1>-<m>).

Since the human body is a conductor which is grounded, when a finger touches or approaches a channel, both its self-capacitance and mutual capacitance will vary. Therefore, both these types of capacitance can be utilized for touch recognition. In an embodiment, the touch sensing chip may detect a self-capacitance or mutual capacitance change occurring in the OLED touch screen 10 and calculate from the change the location of a finger touch that caused the change. That is, the touch on the OLED touch screen 10 is recognized. For example, in a self-capacitance detection mode, the touch sensing chip may scan each transmit channel and each sense channel to see if there is a change in its self-capacitance to ground. When a finger approaches or comes into contact with the screen, transmit TX and sense RX channels in the vicinity of the finger will experience a rise in self-capacitance. In a mutual capacitance detection mode, the touch sensing chip may detect variation of mutual capacitance between the transmit TX and sense RX channels. In FIG. 1, Cm denotes parasitic capacitance between the transmit TX and sense RX channels, and Cb denotes parasitic capacitance between cathodes of the OLED touch screen 10 and the sense channels RX.

The conventional touch detection circuit 12 usually includes analog front-end circuits AFE and analog-to-digital converter (ADC) circuits ADC.

Figure 2:
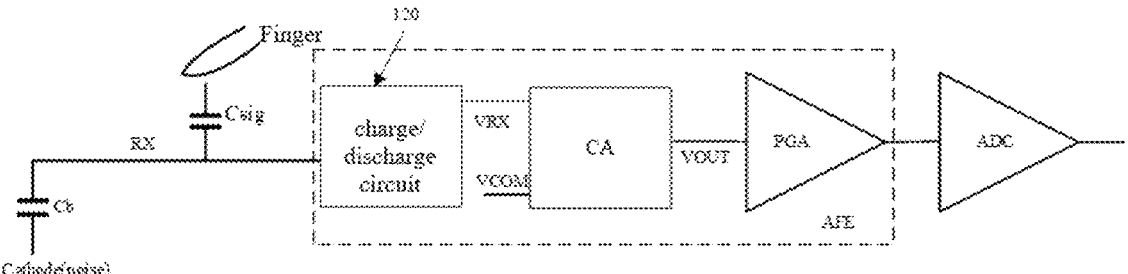
FIG. 2 is a schematic structural view of a touch detection circuit in the conventional touch sensing chip.

FIG. 2 shows operation of an analog front-end circuit AFE in the conventional touch detection circuit 12 for use in the OLED touch screen. For example, the analog front-end circuit AFE operates in a self-capacitance detection mode. The analog front-end circuit AFE includes a charge/discharge circuit 120, a charge integrator CA and a programmable gain amplifier PGA. In FIG. 2, Cathode denotes a respective cathode of the OLED touch screen; Csig, capacitance between a finger and a respective sense channel RX produced as a result of a touch on the OLED touch screen by the finger (i.e., a capacitance component between the finger and the touch screen); and Cb, parasitic capacitance between the cathode and the sense channel RX, which is often as high as several hundred pF. When noise from the cathode Cathode is not considered, Cb can be considered as parasitic capacitance between the sense channel RX and a ground AVSS.

Given the fact that Csig is produced by a touch on the screen by a finger or the like and disappears after the finger leaves the screen, the touch sensing chip operates by determining the presence and location of a touch on the OLED touch screen 10 through scanning each of the transmit and sense channels to find whether there is a change in its self-capacitance to ground (i.e., to find out the presence of Csig).

With combined reference to FIG. 2, in an initial scan performed by the touch sensing chip (there is no finger touch on the OLED touch screen), the charge/discharge circuit 120 pulls the sense channel RX to a ground potential and resets the charge integrator CA. After that, the charge/discharge circuit 120 charges the sense channel RX to a potential VRX equal to a common reference voltage VCOM. In this process, an amount of charge Q delivered by a current source I0 to the sense channel RX can be expressed as Q=VCOM*Cb. After that, the charge/discharge circuit 120 converts the amount of charge Q into a voltage VRX and provides it to the charge integrator CA, which then carries out charge integration based on both the voltage VRX and the common reference voltage VCOM and thus obtains an output voltage VOUT corresponding to a sense signal on the sense channel RX and relating to VOUT and VCOM*Csig. In response to any finger touch, this scanning process is repeated.

The programmable gain amplifier PGA is generally designed to operate in a correlated double sampling mode, in which a first VOUT sample is taken and denoted as VOUT1 and a second VOUT sample is taken and denoted as VOUT2 in each scanning period. If there is no finger touch, Csig=0, and a voltage difference between the two VOUT samples will be obtained as ΔVOUT=VOUT2−VOUT1=0. If there is a finger touch, Csig≠0, and a voltage difference between the two VOUT samples will be obtained as ΔVOUT≠0. This ΔVOUT is amplified by PGA and provided to ADC for quantization.

In this way, with combined reference to FIGS. 1 and 2, based on the results of quantization of ADC<1>-ADC<n>, the presence and location of a touch on the touch screen can be determined.

The present invention will be described in greater detail below by way of specific embodiments with reference to FIGS. 3 to 9. From the following description, advantages and features of the invention will become more apparent. Note that the figures are provided in a very simplified form not necessarily drawn to exact scale and only for the sake of easier and clearer description of the embodiments disclosed herein.

Embodiment 1

Figure 3:
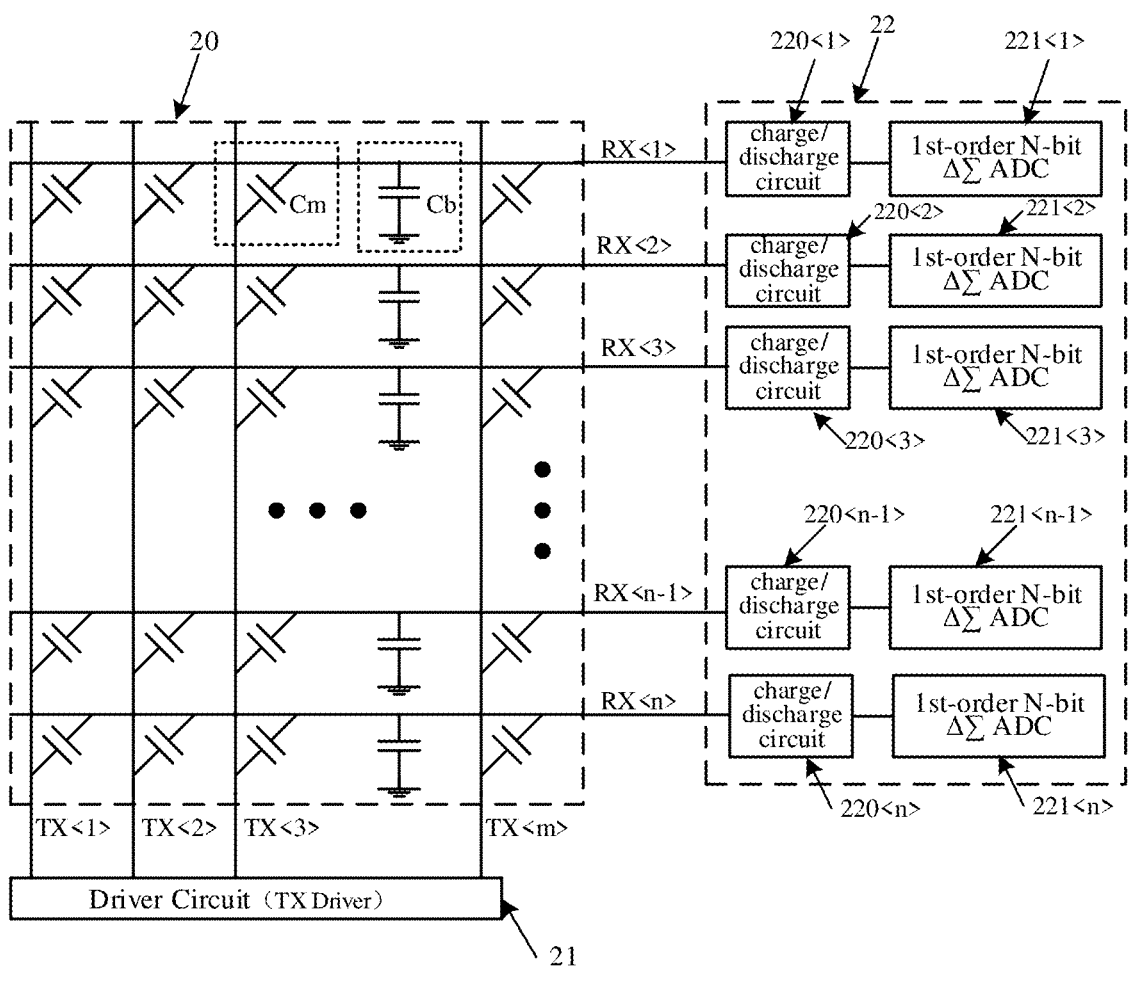
FIG. 3 schematically illustrates operation of a touch sensing chip according to a first embodiment of the present invention.

Referring to FIG. 3, a touch detection circuit 22 according to one embodiment of the present invention is shown, which is coupled to a touch screen 20 and used to detect capacitance variation in the touch screen 20. Results of detection of the touch detection circuit 22 can be used to determine the location of a touch event occurring on the touch screen 20 and a user's touch operation.

The touch screen 20 may be an OLED touch screen or any other touch screen, which has m longitudinally running transmit channels TX (i.e., TX<1>-<m>) and n transversely running sense channels RX (i.e., RX<1>-RX<n>). The transmit channels TX cross the sense channels RX at sense nodes, and both m and n depend on the size and shape of the touch screen 20.

In this embodiment, the touch detection circuit 22 includes a number of touch detection branches (not labeled in FIG. 3). The number of touch detection branches is equal to that of sense channels RX, and each of the touch detection branches is coupled to a respective one of the sense channels RX. Each touch detection branch includes a charge/discharge circuit 220 and a first-order N-bit delta-sigma analog-to-digital converter (referred to hereinafter as the "$1^{st}$-order N-bit ΔΣADC") 221. For example, the charge/discharge circuit 220<1> is coupled to the sense channel RX<1> and the $1^{st}$-order N-bit ΔΣADC 221<1>; the charge/discharge circuit 220<2> is coupled to the sense channel RX<2> and the $1^{st}$-order N-bit ΔΣADC 221<2>; the charge/discharge circuit 220<3> is coupled to the sense channel RX<3> and the $1^{st}$-order N-bit ΔΣADC 221<3>; . . . ; the charge/discharge circuit 220<n−1> is coupled to the sense channel RX<n−1> and the $1^{st}$-order N-bit ΔΣADC 221<n−1>; and the charge/discharge circuit 220<n> is coupled to the sense channel RX<n> and the $1^{st}$-order N-bit ΔΣADC 221<n>.

It would be appreciated that, in other embodiments of the present invention, one touch detection branch may be coupled to multiple sense channels RX.

In this embodiment, the charge/discharge circuit 220 is used to charge or discharge the respective sense channel RX coupled thereto over a scanning period, thereby converting a sense signal on the sense channel RX into corresponding sense charge Qsig.

The charge/discharge circuit 220 may employ any suitable circuit design. As an example, referring to FIG. 4, the charge/discharge circuit 220 includes first to third switches S1-S3 and a current source I0. A terminal of the current source I0 is coupled to a first power supply voltage AVSS (provided by an internal ground voltage, which may differ from an external ground voltage, or be of 0 V), and another terminal of the current source I0 is coupled to a terminal of the second switch S2. Another terminal of the second switch S2 is coupled to a terminal of the first switch S1, a terminal of the third switch S3 and the sense channel RX. Another terminal of the first switch S1 is coupled to a common reference voltage VCOM, and another terminal of the third switch S3 is coupled to an input terminal of the $1^{st}$-order N-bit ΔΣADC 221.

Figure 4:
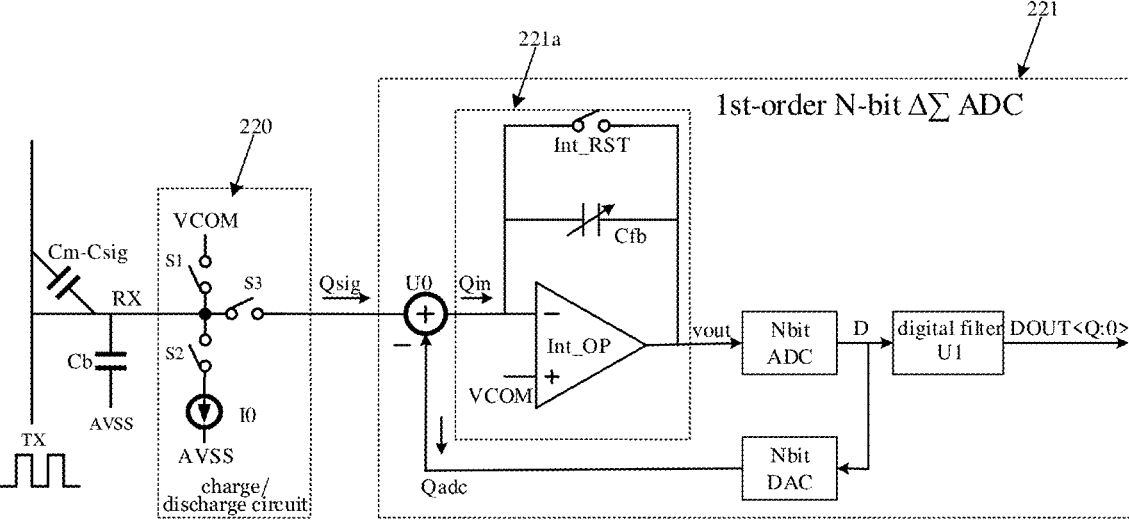
FIG. 4 is a schematic structural view of a touch detection circuit according to the first embodiment of the present invention.

With continued reference to FIG. 4, in this embodiment, the $1^{st}$-order N-bit ΔΣADC 221 includes an adder U0, an integrator 221a, an N-bit analog-to-digital converter ("N-bit ADC"), an N-bit digital-to-analog converter ("N-bit DAC") and a digital filter U1. The integrator 221a includes an integrator amplifier Int_OP, an integrator capacitor Cfb and an integrator switch Int_RST.

The components in the $1^{st}$-order N-bit ΔΣADC 221 are coupled as follows:

An input terminal of the adder U0 serves as the input terminal of the $1^{st}$-order N-bit ΔΣADC 221 and is coupled to an output terminal of the charge/discharge circuit 220 to receive the sense charge Qsig. Another input terminal of the adder U0 is coupled to an output terminal of the N-bit DAC. An output terminal of the adder U0 is coupled to a first input terminal (inverting input terminal "-") of the integrator amplifier Int_OP, a terminal of the integrator capacitor Cfb and a terminal of the integrator switch Int_RST. A second input terminal (non-inverting input terminal "-") of the integrator amplifier Int_OP is coupled to the common reference voltage VCOM (also known as a "common-mode voltage"), and an output terminal of the integrator amplifier Int_OP is coupled to an input terminal of the N-bit ADC, another terminal of the integrator capacitor Cfb and another terminal of the integrator switch Int_RST. An output terminal of the N-bit ADC is coupled to an input terminal of the N-bit DAC and an input terminal of the digital filter U1. An output terminal of the digital filter U1 serves as an output terminal of the $1^{st}$-order N-bit ΔΣADC 221. N is an integer satisfying N≥2. A greater N value means higher precision of the N-bit ADC and N-bit DAC.

The integrator 221a is configured to integrate net incoming charge Qin that it receives. The N-bit ADC is configured to quantize an output of the integrator 221a into an N-bit digital signal D. The digital filter U1 is configured to filter the N-bit digital signal D (D1-DN in FIG. 5), convert it into a Q-bit digital signal DOUT<Q:0> and output it, where Q>N. The N-bit DAC is configured to provide subtractive reference charge Qadc under the control of the N-bit digital signal D. The adder U0 is configured to derive the net incoming charge Qin by subtracting the subtractive reference charge Qadc from the sense charge Qsig.

It would be appreciated that each of the adder U0, the N-bit ADC, the N-bit DAC and the digital filter U1 in the $1^{st}$-order N-bit ΔΣADC 221 and the integrator amplifier Int_OP in the integrator 221*a* may be of any suitable circuit design. The digital filter U1 may be implemented either as an FIR filter, or as an IIR filter.

Figure 5:
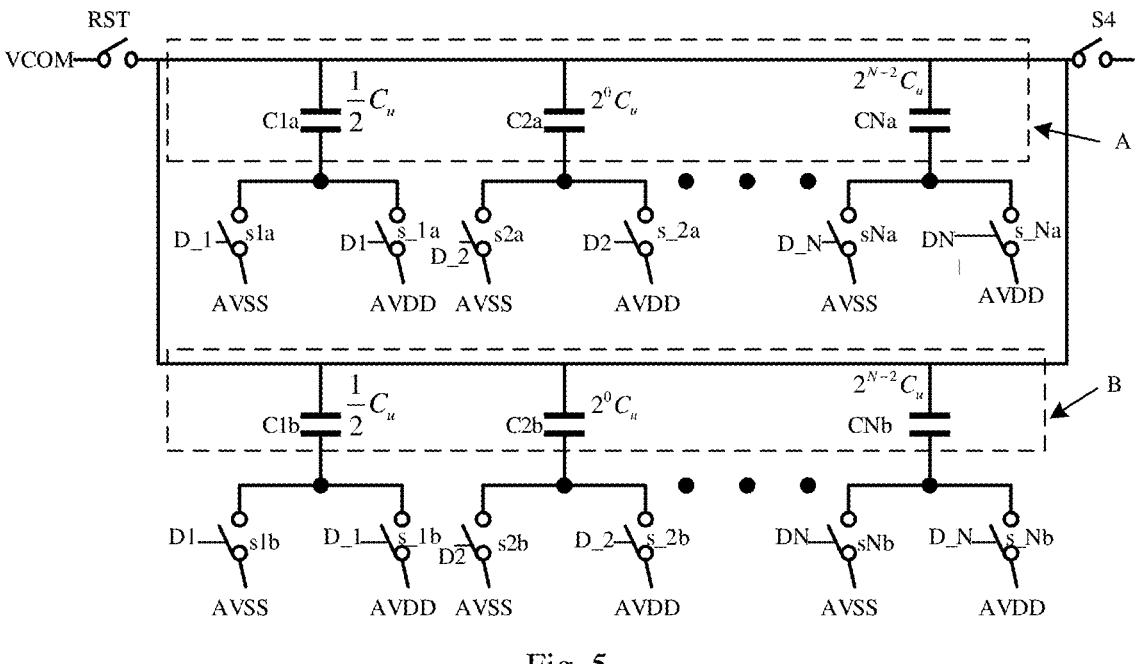
FIG. 5 is a schematic circuit view of an N-bit DAC in the touch detection circuit according to the first embodiment of the present invention.

Referring to FIG. 5, in this embodiment, the N-bit DAC includes two capacitor arrays A and B, which are identical and connected in parallel. The capacitor array A include N capacitors denoted as C1*a*-Cna, and the capacitor array B include N capacitors denoted as C1*b*-CNb.

The capacitors C1*a*-Cna correspond to the respective capacitors C1*b*-CNb. The N capacitors C1*a*-Can have different capacitances, in which each value after the first that is equal to Cμ/2 is equal to the previous one times 2. The N capacitors C1*b*-CNb also have different capacitances, in which each value after the first that is Cμ/2 is equal to the previous one times 2. That is, C1*a*=C1*b*=Cμ/2; C2*a*=C2*b*=$2^0$Cμ=Cμ; C3*a*=C3*b*=2Cμ; . . . ; and CNa=CNb=$2^{N-2}$Cμ. That is to say, the capacitances of the capacitors C1*a*-Cna form a geometric sequence with common ratio 2, and the capacitances of the capacitors C1*b*-CNb also form a geometric sequence with common ratio 2.

Moreover, top plates of the capacitors C1*a*-CNa and C1*b*-CNb (i.e., one terminal of each capacitor) are all coupled to the common reference voltage VCOM through a reset switch RST and to a common master switch S4. When S4 is closed, the N-bit DAC outputs the subtractive reference charge Qdac. A bottom plate of each of the capacitors C1*a*-CNa and C1*b*-CNb (i.e., another terminal thereof) is coupled to a terminal of each of two control switches. Control terminals of the two control switches are coupled to a respective one of the digital signals D1-DN and its inverted version, respectively. Additionally, one of the two control switches is coupled to the first power supply voltage AVSS (provided by an internal ground voltage, which may differ from an external ground voltage, or be of 0 V), and the other is coupled to a second power supply voltage AVDD (which may be provided by an operating voltage of the system). For example, the bottom plate of the capacitor C1*a* is coupled to a terminal of a control switch s1*a* and a terminal of a control switch s_1*a*. Another terminal of the control switch s1*a* is coupled to AVSS, and another terminal of the control switch s_1*a* is coupled to AVDD. A control terminal of the control switch s_1*a* is coupled to the digital signal D1 output from the N-bit ADC, and a control terminal of the control switch s1*a* is coupled to the inverted version D_1 of the digital signal D1. The bottom plate of the capacitor C2*a* is coupled to a terminal of a control switch s2*a* and a terminal of a control switch s_2*a*. Another terminal of the control switch s2*a* is coupled to AVSS, and another terminal of the control switch s_2*a* is coupled to AVDD. A control terminal of the control switch s_2*a* is coupled to the digital signal D2 output from the N-bit ADC, and a control terminal of the control switch s2*a* is coupled to the inverted version D_2 of the digital signal D2. The bottom plate of the capacitor CNa is coupled to a terminal of a control switch sNa and a terminal of a control switch s_Na. Another terminal of the control switch sNa is coupled to AVSS, and another terminal of the control switch s_Na is coupled to AVDD. A control terminal of the control switch s_Na is coupled to the digital signal DN output from the N-bit ADC, and a control terminal of the control switch sNa is coupled to the inverted version D_N of the digital signal DN. The bottom plate of the capacitor C1*b* is coupled to a terminal of a control switch s1*b* and a terminal of a control switch s_1*b*. Another terminal of the control switch s1*b* is coupled to AVSS, and another terminal of the control switch s_1*b* is coupled to AVDD. A control terminal of the control switch s1*b* is coupled to the digital signal D1, and a control terminal of the control switch s_1*b* is coupled to the inverted version D_1 of the digital signal D1 output from the N-bit ADC. The bottom plate of the capacitor C2*b* is coupled to a terminal of a control switch s2*b* and a terminal of a control switch s_2*b*. Another terminal of the control switch s2*b* is coupled to AVSS, and another terminal of the control switch s_2*b* is coupled to AVDD. A control terminal of the control switch s2*b* is coupled to the digital signal D2 output from the N-bit ADC, and a control terminal of the control switch s_2*b* is coupled to the inverted version D_2 of the digital signal D2. The bottom plate of the capacitor CNb is coupled to a terminal of a control switch sNb and a terminal of a control switch s_Nb. Another terminal of the control switch sNb is coupled to AVSS, and another terminal of the control switch s_Nb is coupled to AVDD. A control terminal of the control switch sNb is coupled to the digital signal DN output from the N-bit ADC, and a control terminal of the control switch s_Nb is coupled to the inverted version D_N of the digital signal DN.

When the reset switch RST is closed, the N-bit DAC is reset. When the bottom plate of a capacitor in the capacitor array A, which corresponding to a bit, is coupled to AVSS, the bottom plate of a capacitor in the capacitor array B, which corresponds to the same bit (i.e., the capacitor having the same capacitance as said capacitor in the capacitor array A), is coupled to AVDD.

In this embodiment, the N-bit DAC is of a capacitance-distributed structure, in which a total capacitance for each bit of the N-bit DAC is equally divided into two smaller capacitances, which are distributed to respective two capacitors corresponding to the specific bit arranged respectively in the capacitor arrays A and B. For example, the total capacitance for the first bit is divided into Cμ/2+Cμ/2, the total capacitance for the second bit is divided into Cμ+Cμ, . . . , and the total capacitance for the N-th bit is divided into $2^{N-2}$*Cμ+$2^{N-2}$*Cμ. When the N-bit DAC is reset as a result of RST being closed, if all the capacitors in the capacitor array A are coupled to AVDD, then all the capacitors in the capacitor array B will be coupled to AVSS. This is equivalent to coupling the bottom plate of each capacitor to (AVDD+AVSS)/2 as a result of the N-bit DAC being reset, which can dispense with involving the common-mode voltage VCOM, avoiding unequal absolute amounts of charge transferred during switching from VCOM to AVDD and from VCOM to AVSS. This can mitigate non-linearity of the N-bit DAC and increase the resolution of the touch detection circuit 22 of capacitance detection for finger touches.

Further, the total capacitances for the bits of the N-bit DAC are also involved in the subtraction of the subtractive reference from the sense charge Qsig, i.e., Qin=Qsig–Qdac. After the system has stabilized (i.e., when the outputs of the $1^{st}$-order N-bit ΔΣADCs 221 reach equilibrium), in each scan, Qin(k)=Qsig(k)–Qdac(k–1)~0, k denotes the k-th scanning period. Thus, in each scan, inputs to the integrators 221*a* are all zero. This allows for quick stabilization and more sensitive touch detection.

Notably, according to this embodiment, capacitances of the integrator capacitors Cfb in the touch detection circuit 22 are adjustable. Accordingly, through directly adjusting the capacitances of the integrator capacitors Cfb, the $1^{st}$-order N-bit ΔΣADCs 221 are enabled to output the digital signals with desired precision. Alternatively, the N-bit ADCs may have an adjustable range of measurement. In this case, desired precision of the digital signals output from the $1^{st}$-order N-bit ΔΣADCs 221 may be obtained by directly adjusting the range of measurement of the N-bit ADCs.

The touch detection circuit of this embodiment may operate by mutual capacitance detection (i.e., in a mutual capacitance scan mode). When a touch event occurs as a result of a conductor like a finger approaching or coming into contact with the touch screen 20, Csig will be produced (i.e., a capacitance component between the finger and the touch screen), causing a change in mutual capacitance between transmit TX and sense RX channels at the location of the touch event, from Cm to Cm-Csig (i.e., equivalent parasitic capacitance between the transmit TX and sense RX channels varies). The respective touch detection branches in the touch detection circuit 12 can detect the presence of Csig. When the conductor (e.g., a finger) leaves the screen (i.e., there is no touch event any more, or the touch event is cancelled), Csig disappears. Therefore, the presence of Csig in the touch screen 10 can be determined from results of detection of all the touch detection branches in the touch detection circuit 12 coupled to the touch screen 10. Accordingly, the occurrence and location of a touch event on the touch screen 10 can be determined.

Figure 6:
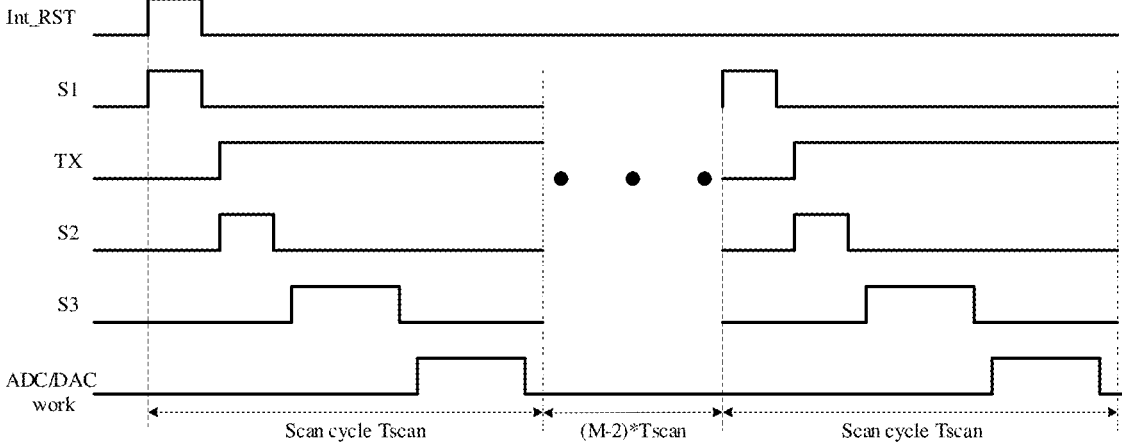
FIG. 6 is a schematic timing diagram showing operation of the touch detection circuit according to the first embodiment of the present invention.

Reference is made to FIG. 6, a timing diagram showing an operation of the touch detection circuit of FIG. 4 for encoding a rising edge of TX (here, the term "encoding" refers to causing TX to transition from a low level to a high level). In the mutual capacitance detection mode, a code sequence (i.e., drive signals) is loaded onto the transmit channels TX at a predetermined time interval, and each sense channel RX is encoded when receiving a signal indicating a change of capacitance.

In an embodiment, at the beginning of the operation, Int_RST transitions high, closing the integrator switch, and S1 transitions high, closing the first switch. As a result, the integrator 221a is reset. During the reset of the integrator 221a, a potential of the sense channel RX is pulled down to VCOM. After the reset is completed, Int_RST transitions low, turning off the integrator switch. In response, S1 transitions low, turning off the first switch. When TX transitions high (i.e., from a low level to a high level), the second switch is closed (turned on) (as a result of S2 transitioning high), allowing the current source I0 in the charge/discharge circuit 220 to charge or discharge the sense channel RX to accomplish reference subtraction. As a result, any capacitance variation Csig is converted into sense charge Qsig carrying information about a finger touch. After that, the third switch is closed (as a result of S3 transitioning high), allowing the sense charge Qsig to be transferred to the $1^{st}$-order N-bit ΔΣADC 221 for quantization. As Qsig produced in the presence of a finger touch differs from that produced in the absence of a finger touch, quantizing a difference therebetween allows determining the magnitude of Csig and hence the presence of a touch.

As can be seen from FIG. 6, the touch detection circuit 22 employs an oversampling technique operating at an oversampling rate of M. In this way, when the digital signals DOUT<Q:0> output from the digital filters U1 are required to provide 12-bit precision (i.e., Q=12), the bit count of the N-bit ADC does not have to be 12. Instead, N may be smaller than 12, for example, 6 to 8. With this arrangement, 12-bit precision can be easily achieved through sampling with the N-bit ADCs and digital filtering with the digital filters U1. This can significantly reduce design complexity and area of the N-bit ADCs in the $1^{st}$-order N-bit ΔΣADCs 221, as well as linearity and other performance requirements on the N-bit DACs.

Figure 7:
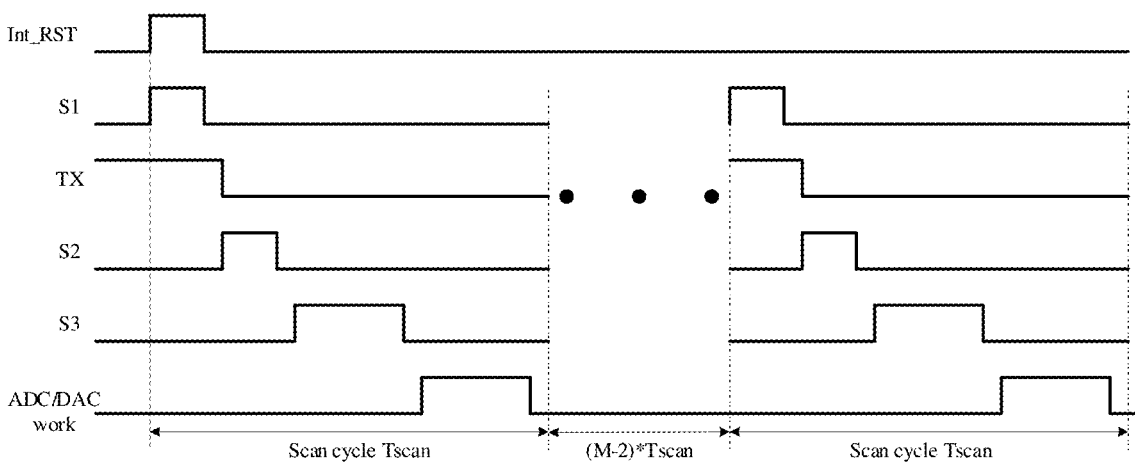
FIG. 7 is a schematic timing diagram showing operation of the touch detection circuit according to the first embodiment of the present invention in another mode.

Alternatively, the touch detection circuit shown in FIGS. 3 and 4 may employ falling edge encoding for touch detection. FIG. 7 is a timing diagram showing an example of operation in this case. During reset, TX remains high. After the reset is completed, Int_RST transitions low, turning off the integrator switch. In response, S1 transitions low, turning off the first switch. When TX transitions low (i.e., from a high level to a low level), encoding begins. The second switch is closed (turned on) (as a result of S2 transitioning high), allowing the current source I0 in the charge/discharge circuit 220 to charge or discharge the sense channel RX. This process is similar to that in the embodiment of FIG. 6 employing rising edge encoding and, therefore, needs not be described in further detail herein.

Referring to FIG. 3, in this embodiment, there is also provided a touch sensing chip including the touch detection circuit of this embodiment.

Optionally, the touch sensing chip may further include a driver circuit 21 coupled to the transmit channels TX in the touch screen 20. In other embodiments of the present invention, the driver circuit 21 may be integrated into a driver chip separate from the touch sensing chip.

Referring to FIG. 3, in this embodiment, there is also provided an electronic device including the touch screen and the touch sensing chip of this embodiment.

The touch sensing chip and the electronic device both have improved performance because of the touch detection circuit of this embodiment incorporated therein.

Embodiment 2

Figure 8:
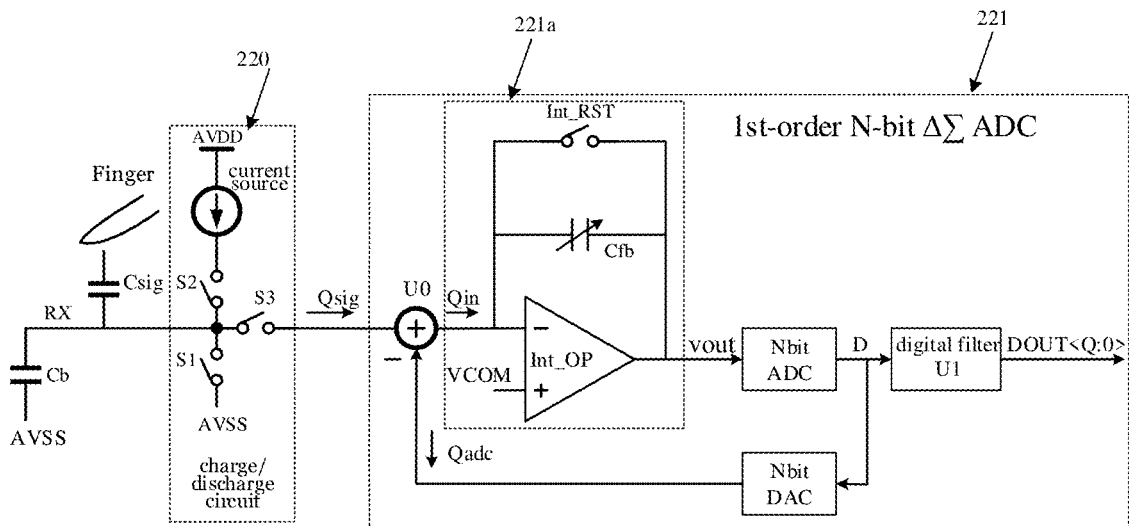
FIG. 8 is a schematic structural view of a touch detection circuit according to a second embodiment of the present invention.

Referring to FIGS. 3 and 8, in a further embodiment of the present invention, there is provided a touch detection circuit, which is coupled to a touch screen 20 and used to detect capacitance variation in the touch screen 20. Results of detection of the touch detection circuit 22 can be used to determine the location of a touch event occurring on the touch screen 20 and a user's touch operation. The touch detection circuit 22 includes a number of touch detection branches (not labeled in FIG. 3). The touch detection branches may be coupled to respective sense channels RX, or may be each coupled to a plurality of sense channels RX.

Each touch detection branch includes a charge/discharge circuit 220 and a $1^{st}$-order N-bit ΔΣADC 221. For example, the charge/discharge circuit 220<1> is coupled to the sense channel RX<1> and the $1^{st}$-order N-bit ΔΣADC 221<1>; the charge/discharge circuit 220<2> is coupled to the sense channel RX<2> and the $1^{st}$-order N-bit ΔΣADC 221<2>; the charge/discharge circuit 220<3> is coupled to the sense channel RX<3> and the $1^{st}$-order N-bit ΔΣADC 221<3>; . . . ; the charge/discharge circuit 220<n−1> is coupled to the sense channel RX<n−1> and the $1^{st}$-order N-bit ΔΣADC 221<n−1>; and the charge/discharge circuit 220<n> is coupled to the sense channel RX<n> and the $1^{st}$-order N-bit ΔΣADC 221<n>.

The touch detection circuit 22 of this embodiment differs from that of the first embodiment in 1) operating by self-capacitance scanning (or in a self-capacitance detection mode) to determine the location of a touch event occurring on the touch screen 20 and 2) each charge/discharge circuit

220 including first to third switches S1-S3 and a current source I0. A terminal of the current source I0 is coupled to a second power supply voltage AVDD, and another terminal thereof is coupled to a terminal of the second switch S2. Another terminal of the second switch S2 is coupled to a terminal of the first switch S1, a terminal of the third switch S3 and the respective sense channel RX. Another terminal of the first switch S1 is grounded, and another terminal of the third switch S3 is coupled to an input terminal of the respective 1$^{st}$-order N-bit ΔΣADC 221.

Figure 9:
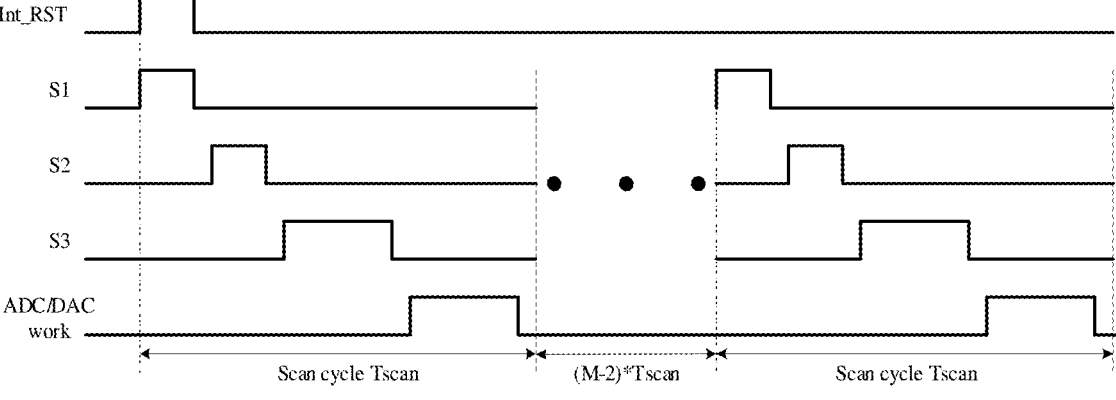
FIG. 9 is a schematic timing diagram showing operation of the touch detection circuit according to the second embodiment of the present invention.

FIG. 9 is a timing diagram showing operation of the touch detection circuit according to this embodiment. In the operation, first of all, Int_RST transitions high, closing the integrator switch, and S1 transitions high, closing the first switch. As a result, the integrator 221a is reset. During the reset of the integrator 221a, the charge/discharge circuit 220 discharges the sense channel RX until a potential of the sense channel RX is pulled down to a ground potential. After the reset is completed, Int_RST transitions low, turning off the integrator switch. In response, S2 transitions high, closing the second switch. As a result, the charge/discharge circuit 220 charges the sense channel RX over the period in which S2 stays high. In this way, any self-capacitance variation Csig is converted into sense charge Qsig carrying information about a finger touch. At the end of the charging process, S3 transitions high, closing the third switch. In response, the 1$^{st}$-order N-bit ΔΣADC 221 quantizes the sense charge Qsig.

As can be seen from the above-described operation, the current source I0 charges the sense channel RX when S2 is high, and the sense channel RX is charged to a voltage in the presence of a finger touch, which is lower than a voltage that the sense channel RX is charged to in the absence of a finger touch. Accordingly, Qsig produced in the presence of a finger touch differs from that produced in the absence of a finger touch, and this difference can be utilized to determine the magnitude of Csig and hence the presence of a touch.

Similar to the touch detection circuit of the first embodiment, the touch detection circuit of this embodiment also has a much simpler structure with increased ease of design. Likewise, the N-bit DACs in the 1$^{st}$-order N-bitΔΣ ADCs are also involved in reference subtraction from sense charge. In each scan, as net charge input to the integrators in the 1$^{st}$-order N-bitΔΣ ADCs is almost zero, the integrator can rapidly stabilize, resulting in increased touch operation sensitivity.

Referring to FIG. 3, in this embodiment, there is also provided a touch sensing chip including the touch detection circuit of this embodiment.

Optionally, the touch sensing chip may further include a driver circuit 21 coupled to the transmit channels TX in the touch screen 20. In other embodiments of the present invention, the driver circuit 21 may be integrated into a driver chip separate from the touch sensing chip.

Referring to FIG. 3, in this embodiment, there is also provided an electronic device including the touch screen and the touch sensing chip of this embodiment.

The touch sensing chip and the electronic device both have improved performance because of the touch detection circuit of this embodiment incorporated therein.

The description presented above is merely that of a few preferred embodiments of the present invention and is not intended to limit the scope thereof in any sense. Any and all changes and modifications made by those of ordinary skill in the art based on the above teachings fall within the scope as defined in the appended claims.

What is claimed is:

1. A touch detection circuit, comprising:
   a charge/discharge circuit, which is coupled to a corresponding sense channel of a touch screen and is configured to charge or discharge the sense channel over a scanning period, thereby converting a sense signal on the sense channel into corresponding sense charge;
   a first-order N-bit delta-sigma analog-to-digital converter (ADC) comprising an adder, an integrator, an N-bit ADC and an N-bit digital-to-analog converter (DAC), the adder comprising two input terminals coupled respectively to an output terminal of the charge/discharge circuit and an output terminal of the N-bit DAC, the N-bit DAC comprising an input terminal coupled to an output terminal of the N-bit ADC, where N is an integer satisfying N≥2,
   wherein the integrator is configured to integrate net incoming charge that the integrator receives; the N-bit ADC is configured to quantize an output of the integrator into an N-bit digital signal; the N-bit DAC is configured to provide subtractive reference charge according to the instruction of the N-bit digital signal; and the adder is configured to derive the net incoming charge by subtracting the subtractive reference charge from the sense charge, and
   wherein the N-bit DAC comprises two capacitor arrays, which are identical and connected in parallel, each capacitor array comprising N capacitors, a first terminal of each capacitor coupled to a common reference voltage through a reset switch, a second terminal of each capacitor coupled to a first power supply voltage or a second power supply voltage according to the N-bit digital signal, the N capacitors having different capacitances forming a geometric sequence with a starting value of Cμ/2 and with a common ratio of 2, where Cμ is a constant value.

2. The touch detection circuit of claim 1, wherein after the first-order N-bit delta-sigma ADC circuit stabilizes, the net incoming charge is equal to or close to 0.

3. The touch detection circuit of claim 1, wherein the integrator comprises an integrator amplifier, an integrator capacitor and an integrator switch, the integrator amplifier comprising a first input terminal coupled to an output terminal of the adder, a first terminal of the integrator capacitor and a first terminal of the integrator switch, the integrator amplifier comprising a second input terminal coupled to a common reference voltage, the integrator amplifier comprising an output terminal coupled to an input terminal of the N-bit ADC, a second terminal of the integrator capacitor and a second terminal of the integrator switch.

4. The touch detection circuit of claim 3, wherein a capacitance of the integrator capacitor is adjustable, precision of the N-bit digital signal associated with the capacitance of the integrator capacitor.

5. The touch detection circuit of claim 3, wherein a range of measurement of the N-bit ADC is adjustable, precision of the N-bit digital signal associated with the range of measurement of the N-bit ADC.

6. The touch detection circuit of claim 1, wherein when the N-bit DAC is reset, the second terminal of one of the capacitors in one of the capacitor arrays is coupled to the first power supply voltage, the second terminal of a respective one of the capacitors of the same capacitance in the other capacitor array is coupled to the second power supply voltage.

7. The touch detection circuit of claim 1, wherein the first-order N-bit delta-sigma ADC circuit further comprises a digital filter, the digital filter coupled to the output terminal of the N-bit ADC, the digital filter configured to convert the N-bit digital signal into a Q-bit digital signal, where Q is an integer satisfying Q≥N.

8. The touch detection circuit of claim 7, wherein the N-bit ADC utilizes an oversampling technique to sample and quantize the output of the integrator, where Q>N.

9. The touch detection circuit of claim 1, wherein the charge/discharge circuit comprises first, second, third switches and a current source, and wherein in a self-capacitance scan mode, a first terminal of the current source is coupled to a second power supply voltage, a second terminal of the current source is coupled to a first terminal of the second switch, a second terminal of the second switch is coupled to a first terminal of the first switch, a first terminal of the third switch and the sense channel, a second terminal of the first switch is coupled to a first power supply voltage, and a second terminal of the third switch is coupled to the input terminal of the adder.

10. The touch detection circuit of claim 1, wherein the charge/discharge circuit comprises first, second, third switches and a current source, and wherein in a mutual capacitance scan mode, a first terminal of the current source is coupled to a first power supply voltage, a second terminal of the current source is coupled to a first terminal of the second switch, a second terminal of the second switch is coupled to a first terminal of the first switch, a first terminal of the third switch and the sense channel, a second terminal of the first switch is coupled to a common reference voltage, and a second terminal of the third switch is coupled to the input terminal of the adder.

11. The touch detection circuit of claim 1, wherein the touch detection circuit is coupled to the sense channel in one-to-one correspondence.

12. The touch detection circuit of claim 1, wherein the touch detection circuit is coupled to one or more sense channels.

13. A touch sensing chip, comprising the touch detection circuit according to claim 1.

14. An electronic device, comprising a touch screen and the touch sensing chip according to claim 13, the touch screen comprising at least two sense channels and at least two transmit channels, wherein the touch sensing chip is coupled to each of the sense channels and each of the transmit channels.

15. A touch detection circuit, comprising:
a charge/discharge circuit, which is coupled to a corresponding sense channel of a touch screen and is configured to charge or discharge the sense channel over a scanning period, thereby converting a sense signal on the sense channel into corresponding sense charge;
a first-order N-bit delta-sigma analog-to-digital converter (ADC) comprising an adder, an integrator, an N-bit ADC and an N-bit digital-to-analog converter (DAC), the adder comprising two input terminals coupled respectively to an output terminal of the charge/discharge circuit and an output terminal of the N-bit DAC, the N-bit DAC comprising an input terminal coupled to an output terminal of the N-bit ADC, where N is an integer satisfying N≥2, wherein the integrator is configured to integrate net incoming charge that the integrator receives; the N-bit ADC is configured to quantize an output of the integrator into an N-bit digital signal; the N-bit DAC is configured to provide subtractive reference charge according to the instruction of the N-bit digital signal; and the adder is configured to derive the net incoming charge by subtracting the subtractive reference charge from the sense charge, and wherein the charge/discharge circuit comprises first, second, third switches and a current source, and wherein in a self-capacitance scan mode, a first terminal of the current source is coupled to a second power supply voltage, a second terminal of the current source is coupled to a first terminal of the second switch, a second terminal of the second switch is coupled to a first terminal of the first switch, a first terminal of the third switch and the sense channel, a second terminal of the first switch is coupled to a first power supply voltage, and a second terminal of the third switch is coupled to the input terminal of the adder.

16. A touch detection circuit, comprising:
a charge/discharge circuit, which is coupled to a corresponding sense channel of a touch screen and is configured to charge or discharge the sense channel over a scanning period, thereby converting a sense signal on the sense channel into corresponding sense charge;
a first-order N-bit delta-sigma analog-to-digital converter (ADC) comprising an adder, an integrator, an N-bit ADC and an N-bit digital-to-analog converter (DAC), the adder comprising two input terminals coupled respectively to an output terminal of the charge/discharge circuit and an output terminal of the N-bit DAC, the N-bit DAC comprising an input terminal coupled to an output terminal of the N-bit ADC, where N is an integer satisfying N≥2, wherein the integrator is configured to integrate net incoming charge that the integrator receives; the N-bit ADC is configured to quantize an output of the integrator into an N-bit digital signal; the N-bit DAC is configured to provide subtractive reference charge according to the instruction of the N-bit digital signal; and the adder is configured to derive the net incoming charge by subtracting the subtractive reference charge from the sense charge, and wherein the charge/discharge circuit comprises first, second, third switches and a current source, and wherein in a mutual capacitance scan mode, a first terminal of the current source is coupled to a first power supply voltage, a second terminal of the current source is coupled to a first terminal of the second switch, a second terminal of the second switch is coupled to a first terminal of the first switch, a first terminal of the third switch and the sense channel, a second terminal of the first switch is coupled to a common reference voltage, and a second terminal of the third switch is coupled to the input terminal of the adder.

* * * * *